United States Patent

[11] 3,607,264

[72] Inventors Jack Richard Celeste
Westfield;
Victor Fu-Hua Chu, East Brunswick, both of N.J.
[21] Appl. No. 684,945
[22] Filed Nov. 22, 1967
[45] Patented Sept. 21, 1971
[73] Assignee E. I. du Pont de Nemours and Company
Wilmington, Del.

[54] IMAGE REPRODUCTION PROCESS INVOLVING PHOTOHARDENING AND DELAMINATION
14 Claims, No Drawings

[52] U.S. Cl. ........ 96/28, 96/35.1
[51] Int. Cl. ........ G03c 11/12, G03c 5/00
[50] Field of Search ........ 96/28, 35.1, 115 P

[56] References Cited
UNITED STATES PATENTS

| | | | |
|---|---|---|---|
| 3,353,955 | 11/1967 | Colgrove | 96/28 |
| 3,060,024 | 10/1962 | Burg et al. | 96/28 |
| 3,060,026 | 10/1962 | Heiart | 96/28 |
| 3,060,023 | 10/1962 | Burg et al. | 96/28 |
| 3,060,025 | 10/1962 | Burg et al. | 96/28 |
| 3,198,633 | 8/1965 | Cohen et al. | 96/28 |
| 3,342,593 | 9/1967 | Burg | 96/28 |
| 3,408,191 | 10/1968 | Jeffers | 96/28 |

*Primary Examiner*—William D. Martin
*Assistant Examiner*—M. Sofocleous
*Attorney*—Lynn Barratt Morris

ABSTRACT: An image reproduction process in which an element having a support, a photohardenable layer, and an integral, laminated, adherent receptor sheet is (1) exposed, imagewise, to actinic radiation to harden the layer in exposed areas without hardening in the underexposed areas, and (2) delaminated at a temperature above 45° C., causing the unhardened areas of the layer to fail cohesively, whereby a stratum of the unhardened material adheres to the receptor sheet.

IMAGE REPRODUCTION PROCESS INVOLVING PHOTOHARDENING AND DELAMINATION

BACKGROUND OF THE INVENTION

1. Field of the Invention

This invention relates to image reproduction systems that employ photopolymerizable material as the image-reproducing medium. The prior art discloses processes employing elements containing colored or uncolored photopolymerizable material and no integral receptor sheet. In general, these processes require (1) selectively exposing the photopolymerizable layer to actinic radiation, (2) pressing the exposed layer with the surface of a separate image-receptive support, and (3) separating the two surfaces at an elevated temperature. The underexposed areas of the photosensitive layer adhere to the separate image-receptive surface. Additional image-intensifying steps of such processes, especially when clear and colorless photopolymerizable material is used, may include dusting the image-receptive surface with colorant of the desired color, or pressing the image-receptive surface to a colorant-coated surface and then separating. In both aftertreatments, the colored matter will adhere preferentially to the clear, unpolymerized material on the receptor and the unpolymerized material remaining on the base support as described in Assignee's patents to Burg and Cohen, U.S. Pat. Nos. 3,060,023; 3,060,024; and 3,060,025.

2. Description of the Prior Art

The just-mentioned patents disclose thermal transfer of underexposed, unpolymerized areas to an image-receptive surface and intensification of the unpolymerized image areas with colorant materials.

The prior art also includes processes which employ elements having an integral cover sheet, but in these processes, the cover sheet is used only during imagewise exposure, and solely as an oxygen barrier to prevent oxygen inhibition of the photopolymerizaton. The cover sheet has slight adherence to the photopolymerizable layer and is not used as an integral receptor, but is stripped off before pressing the exposed layer to a separate image-receptive surface. Such protected elements and processes are described in Heiart, U.S. Pat. Nos. 3,060,026 and 3,202,508.

SUMMARY OF THE INVENTION

This invention relates to a photopolymer image reproduction process in which an element comprising (a) a suitable support, (b) a photohardenable layer including a photopolymerizable layer, and (c) a laminated, image receptor sheet, is (1) imagewise exposed to actinic radiation sufficient to harden throughout the exposed areas while leaving the underexposed areas unhardened, and (2) delaminated at an operating temperature above 45° C. and between the "-stick" temperatures of the exposed and underexposed areas of the photosensitive layer, thereby causing the material in the underexposed areas to fail cohesively and a stratum thereof to adhere to the cover sheet and any remaining strata to adhere to the support.

A preferred embodiment of the present invention employs imagewise exposure and subsequent thermal delamination and simultaneous image transfer of an unpolymerized image stratum at a temperature of 45° C. or above of an element which comprises, in order, a suitable base, a photopolymerizable layer which may be clear or colored, and an integral, laminated, adherent image receptor sheet. This embodiment represents a simplification over processes which require a separate image receptor, and eliminates the defects that may arise during lamination of the separate receptor to the exposed photosensitive layer.

The process of the invention may also include the aftersteps of dusting with colored particles the underexposed, photopolymerizable layer adhering to either the integral receptor sheet or the original base support after thermal delamination. An alternative aftertreatment may consist of bringing the image-bearing receptor sheet or the base support, after delamination, into temporary contact with a separate support bearing loosely bound colored particles. In both aftertreatments, the colorants will stick only to the underexposed photopolymerizable material, or image, on the respective sheets.

An additional procedure is to retransfer the unpolymerized material, either before or after application of colorant, at an elevated temperature from the integral receptor sheet to a separate image-receptive surface.

Since a stratum of unpolymerized material remains on the support after initial delamination of the cover sheet, multiple copies may be made from the remaining unpolymerized stratum by repeating the thermal transfer as described in U.S. Pat. Nos. 3,060,024 and 3,060,025.

As practicing previously, the use of an integral, image-receptive cover sheet simplifies the process of use of the element and allows for a better quality final product because the critical step of laminating the image-receptive surface (integral cover sheet) to the photopolymerizable layer is performed during manufacture and uniform adherence is obtained. Image distortion that could occur through dimensional changes in applying such separate receptor sheets after exposure is eliminated.

In practicing prior art processes as taught in U.S. Pat. Nos. 3,060,023; 3,060,024; and 3,060,025 it was sometimes difficult to avoid the appearance of background stain in exposed areas of the photopolymerizable layer upon coloring the element. The present invention causes a separation of the exposed and underexposed areas of this layer and results in only underexposed material adhering to the receptor sheet. When this receptor sheet is dusted or colored, the colorant will adhere only in the areas bearing unpolymerized material.

Dusting the receptor sheet or contacting it with a colorant-bearing surface after delamination gives the user greater versatility in choosing the colors he will use in his process. The user may employ the same basic photopolymerizable element with many available coloring materials.

DESCRIPTION OF THE PREFERRED EMBODIMENTS

In general, the invention comprises an image reproduction process in which an element comprising, in order, (a) a support, (b) a photohardenable layer including a photopolymerizable layer, and (c) an integral, image receptor sheet laminated to the photohardenable layer is (1) imagewise exposed sufficiently to polymerize or harden throughout the entire thickness of photosensitive material in the exposed areas of the layer, while causing no substantial hardening in the underexposed areas, and is (2) delaminated at a temperature of at least 45° C., and within the stick temperature of underexposed areas which is at least 10° C. below the stick temperature of exposed areas. The exposed photohardened area has an adhesive value to a receptor of about 0.5 to 10 g./linear inch, the unexposed material has a cohesive value of at least 15 g./linear inch, and the cohesion of the support being between said adhesive values.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

Among suitable photopolymerizable or photohardenable systems are: (1) those in which a photopolymerizable monomer is present alone or in combination with a compatible binder, or (2) those in which the photohardenable group, attached to a polymer backbone, becomes activated on exposure to light and may then cross-link by reacting with a similar group or other reactive sites on adjacent polymer chains. In the second group of suitable photohardenable systems, where the monomer or pendent photohardenable group is capable of addition polymerization, e.g., a vinyl monomer, the photopolymerized chain length may involve addition of many similar units initiated by a single photochemical act. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a cross-linked network can be produced.

The term "underexposed" as used herein is intended to cover the image areas of the photohardenable layers which are completely unexposed or those exposed only to the extent that there is photohardenable compound still present in sufficient quantity that the molecular weight, and therefore the softening temperature, remains substantially lower than that of the complementary exposed image areas. The term "stick temperature" as applied to either an underexposed or exposed area of a photohardenable stratum means the minimum temperature at which the image area in question sticks or adheres, within 5 seconds, under slight pressure, e.g., thumb pressure, to analytical paper (Schleicher & Schull analytical filter paper No. 595) and remains adhered in a layer of at least detectable thickness after separation of the analytical paper from the stratum.

In a preferred photopolymer image reproduction element, the base support is a material which is stable at the operating temperatures of the element. The base support may be coated with a subbing composition as described in Alles U.S. Pat. No. 2,779,684, example IV. Where the integral receptor sheet is opaque, it is necessary that the base support be transparent to the actinic radiation used to expose the photohardenable layer.

If either a simple monomer or monomer-polymer binder system is being used, the element in the preferred process contains a free radical generating addition polymerization initiator in the photopolymerizable layer. In addition, particularly where a photocrosslinkable polymer or dimer system is used the layer may also contain a plasticizing agent.

The receptor sheet material is determined by the product desired as the result of the process of the invention. The receptor sheet, preferably should have low permeability to oxygen and must be thermally stable in the range of operating temperatures.

Suitable materials for use as base supports are disclosed in U.S. Pat. No. 3,060,023.

Suitable free radical initiated, chain propagating addition polymerizable ethylenically unsaturated compounds for use in the simple monomer or monomer-polymer binder photopolymerizable layers are described in Burg et al. U.S. Pat. No. 3,060,023; Celeste et al. U.S. Pat. No. 3,261,686; and in Assignee's Cohen and Schoenthaler U.S. application Ser. No. 370,338, filed May 26, 1964, U.S. Pat. No. 3,380,831, Apr. 30, 1968. Polymers for use in the monomer-polymer binder system and preferred free radical generating addition polymerization initiators are described in U.S. Pat. No. 3,060,023.

Photodimerizable materials useful in the invention are cinnamic acid esters of high molecular weight polyols, polymers having chalcone and benzophenone-type groups, and others disclosed in Chapter 4 of "Light-Sensitive Systems" by Jaromir Kosar published by John Wiley & Sons, Inc., New York, 1965. Photopolymerizable materials capable of photocrosslinking with more than one adjacent polymeric chain to form a network are described in Assignee's U.S. applications Ser. No. 451,300 by A. C. Schoenthaler filed Apr. 1965 now U.S. Pat. No. 3,418,295, Dec. 24, 1968, and Ser. No. 477,016 by J. R. Celeste filed Aug. 3, 1965 abandoned, but first refiled on Sept. 11, 1968 as Ser. No. 759,217, now U.S. Pat. No. 3,469,982, Sept. 30, 1969.

Preferred free radical generating addition polymerization initiators, activatable by actinic light, e.g., ultraviolet and visible light are listed in U.S. Pat. No. 3,060,023 and the other patents referred to above. The initiator combination compositions of photographic silver halide sensitizing agents and bromine donor compounds or reducing aliphatic amines of Belgian patents 682,048 and 682,052, Dec. 5, 1966, are also useful in the photopolymerizable layers of this invention.

Where the polymer is a hard, high-melting compound, a plasticizer is usually used to lower the glass transition temperature and facilitate cohesive failure in the underexposed areas. The plasticizer may be a monomer itself, e.g., diacrylate ester, or any of the common plasticizers which are compatible with the polymeric binder. Among the common plasticizers are polyethylene glycol, phosphate esters, e.g., triphenyl phosphate, and phthalates, e.g., dibenzyl phthalate.

The photohardenable layer thickness can vary according to its composition and the intended use. A preferred range is 0.0001 inch to 0.002 inch, but with some polymeric binders, much greater thicknesses can be used, especially for multiple transfers after initial delamination.

The various dyes, pigments, thermographic compounds and color forming compounds which may be included directly in the photopolymerizable layer are disclosed in U.S. Pat. No. 3,060,026. In addition, the above-mentioned patent also discloses both organic and inorganic filler materials which may be included in the sensitive layer to achieve desired physical characteristics in the layer.

As mentioned above, the receptor sheet material will be determined by its imperviousness to oxygen where oxygen-sensitive photohardenable materials are used, and by the end use to which the process of the invention will be put. Materials such as polyethylene terephthalate, glass, various types of paper, metal sheets, foils, e.g., aluminum, copper, etc., may be used as cover sheets.

The exposure of the photopolymerizable element may be through a two-tone image or a process transparency, e.g., a process negative or positive (an image-bearing transparency consisting solely of substantially transparent areas where the opaque areas are substantially of the same optical density, the so-called line or halftone negative or positive). The image or transparency and the element may or may not be in operative contact, e.g., contact exposure or projection exposure, and in the case of an element that has both support and cover sheet of a transparent material, exposure may be through either side. It is possible to expose through paper or other light-transmitting materials, but a stronger light source or longer exposure times must be used.

Reflex exposure techniques are useful in the process of the invention, especially when office copies are made. By using reflex exposure, copies can be made from opaque supports and translucent supports which may have printed images on both sides. By using this technique there is no loss in speed or resolution, and right reading copies are obtained directly on the cover sheet upon thermal delamination.

Since most of the photohardenable materials preferred in this invention generally exhibit their maximum sensitivity in the ultraviolet range, the light source should furnish an effective amount of this radiation. Such sources include carbon arcs, mercury-vapors arcs, fluorescent lamps with special ultraviolet light-emitting phosphors, argon glow lamps, electronic flash units and photographic flood lamps. Of these the mercury vapor arc, particularly the sunlamp type, and the fluorescent sunlamps, are most suitable. Other light sources are satisfactory when material sensitive to visible light is used. The amount of exposure required for satisfactory reproduction of a given element is a function of exposure time, type of light source used, and distance between light source and element. The proper balance of these three variables for any given set up is best determined by exposing and processing stepwedge test strips.

After the exposure of the photohardenable layer, the cover sheet is delaminated from this layer at an elevated temperature. The heat required to maintain the element at an operating temperature above 45° C. and between the stick temperatures of the exposed and underexposed areas of the photohardenable layer may be applied at any time after exposure and before or at the time of delamination as long as the element is at the required operating temperature during delamination. Heat can be applied by means well known to the art, e.g., rollers, flat or curved heating surfaces or platens, radiant sources, e.g., heating lamps, etc. The preferred operating temperature range is 55° C. to 130° C.

After thermal delamination of the integral receptor sheet, in the case where a clear, colorless photohardenable material is to be colored, or where it is desired to change certain physical properties, such as electrical conductance, hydrophilicity, etc., the photohardenable material on the cover sheet may be subjected to a dusting treatment similar to that disclosed in U.S. Pat. No. 3,060,024. Depending on the type of photohardenable material used, it may or may not be necessary to heat the element to soften the underexposed material to allow the dusted material to stick to it. Generally, however, between adhesion (in the case of a dusted colorant, higher color density) is effected when the cover sheet is heated to a temperature between 55° C. and 130° C., finely divided particles of the coloring or other materials are dusted onto the cover sheet while it is at the elevated temperature; and after the cover sheet has cooled to room temperature the excess dust is removed. The dust particles will remain only in the unhardened image areas.

Another alternative aftertreatment that may be included in the process of this invention, which will accomplish a similar result is similar to the treatment disclosed in U.S. Pat. No. 3,060,025. The integral receptor sheet may or may not need to be heated to a temperature preferably between 55° C. and 130° C., but in either case it is pressed temporarily to a support that has on its surface a coating of loosely bound, particulate matter. On separation from this surface, the loosely bound matter will adhere only to the unhardened image on the cover sheet.

A third aftertreatment is used when it is desired to get a right reading reproduction of the image from an original transparency, or when it is desired to reduce background stain to a minimum. The delaminated cover sheet is heated to an operating temperature between 55° C. and 130° C., and, while at this elevated temperature, is laminated to a separate image receptive surface. Upon delamination, at either room or elevated temperature, the photohardenable material on the cover sheet will adhere to the separate image receptive surface. The cover sheet may be subjected to one of the first two alternative aftertreatments prior to retransfer in which case colored or otherwise treated underexposed material will be transferred to the separate image receptive surface. These two aftertreatments may also be performed directly on the separate image receptive support after the retransfer steps.

Material which may be used as separate image receptive surfaces and materials which may be dusted or loosely bound to a separate surface are disclosed in U.S. Pat. No. 3,060,024 and U.S. Pat. No. 3,060,025.

Because photohardenable material remains on the original support after delamination of the cover sheet, it is possible to make multiple copies on separate image receptive surfaces by bringing them into operative contact with the photohardenable layer on the base support and thermally stripping as described in U.S. Pat. No. 3,060,023. Colorant may be dusted on or otherwise placed (1) on the base support prior to this thermal transfer step or (2) on the image on the separate image-receptive support after the thermal transfer step. The number and quality of these multiple copies will depend on the original thickness of the photohardenable layer.

The invention will be further illustrated by, but is not intended to be limited to, the following detailed examples of various embodiments.

EXAMPLE I

The following solution was prepared:

| | |
|---|---|
| 1. Polyoxyethylated trimethylolpropane triacrylate (Example I of Assignee's French Pat. No. 1,444,298—May 23, 1966) | 70.0 g. |

EXAMPLE I—Continued

| | |
|---|---|
| 2. Trichlorethylene | 400.0 g. |
| 3. 25% methyl methacrylate polymer/trichlorethylene | 360.0 g. |
| 4. 2-Ethylanthraquinone | 1.1 g. |
| 5. Polyoxyethylene dodecyl ether | 15.0 g. |
| 6. Bring total weight with trichlorethylene to: | 1000.0 g. |

The solution was stirred with a magnetic stirrer in a sealed brown bottle at room temperature for about one-half hour. The solution was coated on a 0.004-inch thick polyethylene terephthalate base support which was coated with a thin vinylidene chloride copolymer sublayer as described in example IV of Alles U.S. Pat. No. 2,779,684.

The coating was allowed to dry. A cover sheet of subbed, 0.001-inch thick polyethylene terephthalate was laminated to the clear photopolymerizable layer under the following laminating conditions: temperature—60° C., speed—30 in/min., pressure—4 lbs./in. of nip length.

The element was exposed from the cover sheet side through a positive transparency containing signal strips, a dot gain scale and dot size comparators of 65- to 150-line screens. The exposure was made on a nuArc® "Flip Top" Plate Maker, Model FT26M-2 carbon arc light source. Exposure time was 40 seconds. The cover sheet was stripped from the photosensitive layer at the following conditions: temperature—105° C., speed—40 in/min. (approx.).

Jungle Black toner (C.I. Pigment Black 1) was applied to the cover sheet, while the cover sheet was at 60° C. The excess pigment was removed with a brush and a cotton pad when the cover sheet cooled to room temperature. The pigment adhered to the cover sheet only where photopolymerizable material was transferred to the cover sheet and a sharp, positive, right treading reproduction was obtained on the cover sheet.

The same pigment was applied to the base support, while the support was at 60° C. The excess pigment was removed. The pigment remained only in the areas that contained unpolymerized material. A sharp, positive, wrong reading reproduction was obtained on the base support.

This example illustrated the cohesive nature of the failure in the underexposed areas of the photopolymerizable layer.

EXAMPLE II

The following solutions were prepared:

| | Sol. A | Sol. B |
|---|---|---|
| 1. 1/1—Glycidyl methacrylate/ methyl methacrylate copolymer | 7.1 g. | 7.1 g. |
| 2. Pentaerythritol triacrylate | 3.9 g. | — |
| 3. Polyethylene glycol 300 diacrylate (average molecular weight of diol precursor is 300) | — | 1.5 g. |
| 4. 1-Tert.-butylanthraquinone (1%) | 6 ml. | 6 ml. |
| 5. Crystal violet (0.1 percent) | 30 ml. | 30 ml. |
| 6. Bring total weight with acetone to: | 60.0 g. | 60.0 g. |

Each solution was coated on a sheet of 0.008-inch thick polypropylene and allowed to dry. To this photosensitive layer was laminated a cover sheet of 0.0055-inch thick aluminum which had been treated for 5 minutes in a $H_3PO_4$ solution (62 ml. syrupy $H_3PO_4$/2 1. $H_2O$). The laminating conditions in each case were: temperature—100° C.; pressure—10 lbs.; speed—60 in./min.

Both elements were exposed in the nuArc® carbon arc light source, through a positive lithographic transparency, bearing both line and solid images, for 2 minutes. The aluminum cover sheets were stripped from the supports at a temperature of approximately 100° C. and a speed of 60 in./min. Sharp, positive images made up of unpolymerized material adhered to the aluminum cover sheet in each case, making these sheets useful as lithographic printing plates.

EXAMPLE III

The following solution was prepared:

| | |
|---|---|
| 1. Pentaerythritol triacrylate (refer to example II) | 75.0 g. |
| 2. Trichlorethylene | 400.0 g. |
| 3. 25% Methyl methylacrylate polymer/trichlorethylene | 360.0 g. |
| 4. 2-Ethylanthraquinone | 1.05 g. |
| 5. Polyoxethylene lauryl ether | 15.0 g. |
| 6. Ethyl Violet | 0.9 g. |
| 7. Bring total weight with trichlorethylene to: | 1,000.0 g. |

The solution was stirred with a magnetic stirrer in a sealed brown bottle for approximately one-half hour.

The solution was coated on two sheets of 0.004-inch thick polyethylene terephthalate film which were coated with a subbing agent as in example I. A cleaned copper plate was laminated to the colored photopolymerizable material on one sheet, and a sodium silicate coated, grained aluminum sheet with 5-micron grain depth was laminated to the other sheet. The laminating conditions were: temperature—150° C. for the aluminum cover sheet, 105° C. for the copper cover sheet; speed setting—30 in./min. for both; pressure—approximately 4 lbs./in. of nip length for both.

Both elements were exposed in the nuArc®carbon arc light source of example I, the copper covered element through a negative transparency of a desired printed circuit for 30 seconds, and the aluminum covered element through the positive transparency of example I for 22.5 seconds.

The copper cover sheet was stripped from its base support at the same conditions of temperature and speed as at lamination. A positive colored reproduction of the circuit diagram useful as a resist, adhered to the cover sheet. The transferred image was not smooth, so a post-heating treatment was carried out by placing the copper sheet for 30 seconds on a Corning Pyrex Radiant Heater, Cat. No 604007, which was heated to 230° C. The image smoothed out and assumed a glossy appearance without any noticeable reduction in sharpness.

The aluminum cover sheet was stripped from the base support at the same conditions of temperature and speed as at lamination. The positive image which adhered to the cover sheet showed evidences of stripping patterns. A post-heating treatment, as performed on the copper cover sheet, smoothed the image and eliminated the patterns. In addition, in order to substantially reduce the solubility of the transferred material to trichlorethylene and acetone, the cover sheet was post exposed in the nuArc®machine, and a useful lithographic printing plate resulted.

EXAMPLE IV

The clear photopolymerizable element of example I was exposed on the nuArc® carbon arc for 40 seconds through a transparency containing line and solid image areas. The cover sheet was then delaminated from the photosensitive layer at the following delamination conditions: temperature—112° C.; speed—40 in./min. (approx.).

Benzidene Yellow (C.I. Pigment Yellow 12), Duol® Carmine (C.I. Pigment Red 57), and Jungle Black (C.I. Pigment Black 1) toners were applied to various parts of the cover sheet while the cover sheet was at 60° C. with the excess pigments being carefully removed when the cover sheet cooled to room temperature. A sharp, positive, multicolored image was obtained on the cover sheet.

EXAMPLE V

A thermoplastic photopolymerizable composition was prepared from 12 g. of low-viscosity polyvinyl acetate methacrylate (containing a maximum of 20 mole percent of methacrylate groups and prepared by esterification of 86–89 percent hydrolyzed polyvinyl alcohol), 12 ml. of ethanol, 2.54 g. of polyethylene glycol diacrylate (average molecular weight of diol precursor is 300), 0.009 g. of anthraquinone, and 0.009 g. of p-methoxyphenol, and was coated on a 0.004-inch thick sheet of polyethylene terephthalate film which was subbed as in example I to a dry thickness of 0.002 A cover sheet of 0.001-inch thick, unsubbed, polyethylene terephthalate was laminated over the photosensitive layer at the following conditions; temperature—125° C.; speed—60 in/min.; nip force—4 lbs./in. of nip length.

The element was exposed to light from a 1,800 watt, high-pressure mercury arc lamp, placed 1 inch from the sensitive surface, through a transparency containing both line and solid image areas. The exposure time was 5 seconds.

The cover sheet was stripped from the support at the same conditions of temperature and speed as at lamination, and a clear, positive image of unpolymerized material failed cohesively and partially transferred to the cover sheet.

EXAMPLE VI

The following photopolymerizable composition was prepared:

| Compound | Amount |
|---|---|
| 1. Photocrosslinkable polymer (prepared according to Belgian Pat. No. 680,133, Oct. 27, 1966. | 32.9 g. |
| 2. Inert copolymer binder (methyl methacrylate/hydroxyethyl methacrylate in a monomer ratio of 90/10 | 44.5 g. |
| 3. Triethylene glycol diacetate | 7.2 g. |
| 4. 1-tert.-butylanthraquinone (1%) | 3.9 g. |
| 5. 2,2-methylene bis(4-ethyl-6-t-butyl phenol) | 0.3 g. |
| 6. Methyl ethyl ketone to make | 240.0 g. |

The composition was coated, using a 0.006 inch doctor blade spacing, onto 0.004-inch thick polyethylene terephthalate film resin coated as in example I. After the coating was dried in air, a sheet of degreased aluminum sheet was laminated to the photopolymerizable layer at the following conditions: temperature—120° C.; speed—30 in./min.; pressure—approximately 4 lbs./in. of nip length.

The laminated element was exposed through a process negative through the film side to a 45-amp carbon arc for 30 seconds at a distance of 18 inches.

Delamination was at the same conditions of speed and temperature as lamination. Cohesive failure of the underexposed image areas resulted in a resist capable of withstanding the corrosive effects of conventional $FeCl_3$ etching solutions.

EXAMPLE VII

The following solution was prepared:

| | |
|---|---|
| 1. Polyvinyl cinnamate | 3.6 g. |
| 2. 1-Tert.-butylanthraquinone | 0.4 g. |
| 3. Bring total weight with trichlorethylene to: | 20.0 g. |

The solution was coated with a 0.004-inch blade spacing on a 0.001-inch sheet of polyethylene terephthalate which was coated with a subbing agent made up of 90/10/1 vinylidene chloride/acrylonitrile/itaconic acid. When the photosensitive solution was dry, a cover sheet of cleaned copper plate was laminated to it.

The element was exposed through a transparency-containing line and solid image areas, for 7 minutes on the nuArc® carbon arc light source of example I.

The element was then heated to approximately 100° C. and while at that temperature, the cover sheet was stripped from the support. The undimerized material failed cohesively, resulting in a clear, positive copy of the original image, useable as a resist, adhering to the copper cover sheet.

EXAMPLE VIII

The following solution was prepared:

| | | |
|---|---|---|
| 1. Trichlorethylene | 1200.0 g. |
| 2. Methyl methacrylate polymer | 270.0 g. |
| 3. Polyoxyethylated trimethylolpropane triacrylate (described in example I) | 300.0 g. |
| 4. 2-Ethylanthraquinone | 3.0 g. |
| 5. Polyoxyethylene lauryl ether | 73.0 g. |
| 6. Bring total weight with trichlorethylene to: | 3000.0 g. |

The solution was stirred with a magnetic stirrer for approximately one-half hour, and was then coated on three sheets of 0.004-inch thick polyethylene terephthalate film which was coated with a subbing agent as in example I. Cover sheets of 0.002-inch thick, unsubbed polyethylene terephthalate were then laminated to the photosensitive layer of each sheet.

Each element was exposed in the nuArc® carbon arc light source, through a positive transparency containing both line and solid image areas for 60 seconds.

A. The cover sheet of the first element was thermally delaminated from the support at the following conditions: temperature 125° C; speed 30 in./min. After delamination, the cover sheet was dusted with Monastral® Blue G toner, (C.I. Pigment Blue 16), and the excess was removed with a cotton pad. A sharp, positive image resulted on the cover sheet, with some evidences of background stain in the exposed areas.

B. The cover sheet of the second element was thermally delaminated from its support at the same conditions as in VIII–A. The cover sheet was then laminated to an image receptive surface of 0.005-inch thick, unsubbed cellulose triacetate film, at the following laminating conditions: temperature 125° C.; nip force 4 lbs./in. of nip; speed 30 in/min. The image-receptive surface was then thermally delaminated from the cover sheet at the same conditions of temperature and speed as at lamination. The image-receptive surface was then dusted as was the cover sheet in VIII–A. A sharp, positive image resulted on the image receptive surface, with no trace of background stain.

C. The cover sheet of the third element was thermally delaminated from its support and dusted as in VIII–A. The cover sheet was then laminated to an unsubbed, 0.005-inch thick cellulose triacetate image receptive surface as in VIII–B. Colored, unpolymerized material was transferred to the image-receptive support on delamination as in VIII–B. A positive image comparable to the image obtained in VIII–B adhered to the cellulose triacetate.

D. The film support of the third element, after the cover sheet was delaminated from it, was dusted as in VIII–A. The support was then laminated to a sheet of cellulose triacetate at the laminating conditions described above, except the temperature was 140° C. When the image-receptive surface was thermally delaminated at the same conditions as at lamination a positive image adhered to it. The dusting and delaminating steps were repeated several times, thereby making multiple copies of the original transparency.

EXAMPLE IX

Three elements, as in example VIII, were exposed to the same transparency for the same exposure time as in example VIII.

A 0.001-inch thick polyethylene terephthalate film support was skim coated to a dry thickness of 0.005 inch with a colloidal carbon dispersion prepared from a carbon-water dispersion (50 percent by weight carbon of 73mμ particle size), low-viscosity polyethylene oxide (molecular weight of 100,000) (6 percent by weight based on the weight of carbon) and ethanol to reduce the carbon to 10 percent by weight of the dispersion.

The same four-part experiment as in example VIII was conducted except that instead of dusting with a pigment toner the following steps were performed. The surface to be pigmented was pressed into intimate contact with the dry carbon-surfaced support and the assembly heated by rapidly passing a hot iron preheated to 72° C. over the back surface of the carbon-bearing support. After allowing the two surfaces to cool for 10 seconds, they were separated. The carbon was thereby transferred because it stuck only to the unpolymerized material on the support to be toned.

Results comparable to those of example VIII were obtained with this technique of toning.

EXAMPLE X

Example VIII–A was repeated, except that a reflex exposure of 15 seconds was substituted for a transmitted light exposure, and Jungle Black toner (C.I. Pigment Black 1) was substituted for Monastral® Blue toner. The reflex exposure was made of printed matter on one side of a translucent sheet of paper which had printing on both sides. The exposure was made through the base side of the element with the sheet to be copied in contact with the cover sheet.

A positive, right reading copy was obtained directly on the cover sheet, on thermal delamination.

EXAMPLE XI

The following solutions were prepared:

| Compound | Sol. A | Sol. B |
|---|---|---|
| 1. Methyl methacrylate polymer | 135.0 g. | 135.0 g. |
| 2. Trichlorethylene | 1100.0 g. | 1100.0 g. |
| 3. 2-ethylanthraquinone | 1.5 g. | 1.5 g. |
| 4. 2,2'-dihydroxy-—4-methoxy-benzophenone | | 3.75 g. |
| 5. Polyoxyethylated trimethylolpropane triacrylate (as in example I) | 150.0 g. | 150.0 g. |
| 6. Polyoxyethylene lauryl ether | 22.5 g. | 22.5 g. |
| 7. Bring total weight with trichlorethylene to: | 1500.0 g. | 1500.0 g. |

The solutions were stirred, coated, and dried as in example I. A receptor sheet was applied to both elements and each was exposed as in example I. Thermal delamination after exposure and application of Jungle Black Toner indicated that the element coated with Solution B exhibited improved exposure latitude, and image quality superior to the element coated with Solution A. It was, however, apparent that the incorporation of the 2,2'-dihydroxy-4-methoxybenzophenone, which absorbs radiated in the ultraviolet region, resulted in a loss in the overall rate of photopolymerization initiation.

EXAMPLE XII

Solution B of example XI was prepared, except that 4.5 g. of 2-ethylanthraquinone was incorporated instead of 1.5 g. Coating and processing of an element as in example XI indicated that the addition of more initiator regained the overall loss in the rate of polymerization initiation present in example XI, Solution B, without affecting the improved exposure latitude and superior image quality achieved by adding the UV absorber.

It will be apparent from the foregoing description and examples that the force relationships at the temperatures during delamination are as follows:

|  | Adhesion | > | Cohesion | < | Adhesion |
|---|---|---|---|---|---|
| 1 | (Underexposed photopolymerizable material to cover sheet.) |  | (Underexposed photopolymerizable material.) |  | (Underexposed photopolymerizable material to base.) |
|  | Adhesion | < | Cohesion | $\overline{<}$ | Adhesion |
| 2 | (Exposed photopolymer to cover sheet). |  | (Exposed photopolymer.) |  | (Exposed photopolymer to base.) |

In addition to the process applications described in the above-referenced patents, the present process is useful in making package comprehensives, engineering reproductions, and map prints, and is suited to chemical milling and photolofting processes. The process is also useful in making printed circuits, metal decorating, map printing, silk screen stencils, decoration of woven fabrics, glass and ceramics and in many graphic arts procedures.

The embodiments of the invention in which an exclusive property or privilege is claimed are defined as follows:

1. An image reproduction process which comprises 1. exposing imagewise to actinic radiation a photopolymerizable element comprising
   - a. a support,
   - b. a photohardenable layer, and
   - c. an integral image-receptive cover sheet laminated to said layer, at least one of the support and sheet being transparent to actinic radiation, said exposure being sufficient to harden the layer throughout the exposed area of the layer while leaving the unexposed areas of the layer unhardened, and
2. delaminating the cover sheet at a temperature of at least 55° C. and between the softening temperatures of the exposed and unexposed areas of the photohardenable layer, thereby causing material in the unexposed areas to fail cohesively and a stratum of the layer to adhere to said image-receptive cover sheet and the remaining strata to adhere to the support.

2. A process according to claim 1 wherein said layer is photopolymerizable.

3. A process according to claim 1 wherein said layer is photopolymerizable and contains (i) an addition polymerization initiator, (ii) at least one nongaseous, ethylenically unsaturated compound capable of forming a high polymer by addition polymerization, and (iii) a macromolecular organic polymer binding agent.

4. A process according to claim 1 wherein said support is a hydrophobic macromolecular organic polymer film base.

5. A process according to claim 1 wherein said photohardenable layer contains at least one nongaseous, ethylenically unsaturated compound capable of forming a high polymer by addition polymerization.

6. A process according to claim 1 wherein said cover sheet is a hydrophobic macromolecular organic polymer film.

7. A process according to claim 1 wherein the photohardenable layer is photopolymerizable and contains a crosslinkable acrylic ester as an addition polymerizable component.

8. A process according to claim 1 wherein the photohardenable layer is photopolymerizable and contains a crosslinkable acrylic ester as an addition polymerizable component and a polynuclear quinone initiator.

9. A process according to claim 1 wherein the photohardenable layer is photopolymerizable and contains pentaerythritol triacrylate.

10. A process according to claim 1 wherein the photohardenable layer is photopolymerizable and contains polyoxyethylated trimethylolpropane triacrylate.

11. A process according to claim 1 wherein the photohardenable layer is photocrosslinkable and contains an acrylated glycidyl methacrylate/methyl methacrylate copolymer.

12. A process as set forth in claim 1 wherein the exposed delaminated element is pressed against a receptor surface, and heated to thermally transfer unhardened areas.

13. A process as set forth in claim 12 wherein a colorant is applied to the thermally transferred image.

14. A process as set forth in claim 1, wherein after delaminating the cover sheet, colorant particles are applied to the surface of the image-bearing stratum on said cover sheet.